United States Patent
Kruiskamp

(10) Patent No.: US 11,495,985 B1
(45) Date of Patent: *Nov. 8, 2022

(54) CONSTANT CURRENT CONSTANT VOLTAGE CHARGER BY MEANS OF A PULSE SKIPPING BOOST CONVERTER

(71) Applicant: Dialog Semiconductor B.V., 's-Hertogenbosch (NL)

(72) Inventor: Marinus Wilhelmus Kruiskamp, 's-Hertogenbosch (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 502 days.

This patent is subject to a terminal disclaimer.

(21) Appl. No.: 16/284,118

(22) Filed: Feb. 25, 2019

(51) Int. Cl.
*H02J 7/04* (2006.01)
*H02J 7/16* (2006.01)
*H02J 7/00* (2006.01)
*H03K 5/24* (2006.01)
*H02M 3/156* (2006.01)
*H02J 7/35* (2006.01)
*H02M 1/00* (2006.01)

(52) U.S. Cl.
CPC ......... *H02J 7/00711* (2020.01); *H02M 3/156* (2013.01); *H03K 5/24* (2013.01); *H02J 7/35* (2013.01); *H02M 1/0009* (2021.05)

(58) Field of Classification Search
CPC .................................................. H02J 7/00711
USPC ....................................................... 320/140
See application file for complete search history.

(56) References Cited

U.S. PATENT DOCUMENTS

| | | | | |
|---|---|---|---|---|
| 7,781,943 B1* | 8/2010 | Hamel | ............... | H02N 2/181 |
| | | | | 310/339 |
| 2016/0197508 A1* | 7/2016 | Kruiskamp | ............ | H02M 3/04 |
| | | | | 307/130 |
| 2017/0237282 A1* | 8/2017 | Huang | .................... | H02J 7/345 |
| | | | | 307/48 |
| 2017/0302102 A1* | 10/2017 | Teggatz | ................... | H02J 7/34 |

OTHER PUBLICATIONS

Texas Instruments bq25504 data sheet, ultra low-power boost converter with battery management for energy harvester applicaitons, pp. 1, 11-14, Oct. 2011.
Texas Instruments bq25570 data sheet, nano power boost charger and buck converter for energy harvester powered applicaitons, pp. 1, 13-18, Mar. 2013.

(Continued)

*Primary Examiner* — Yalkew Fantu
(74) *Attorney, Agent, or Firm* — Saile Ackerman LLC; Stephen B. Ackerman

(57) ABSTRACT

A charging circuit and a method with an inductor, an input to receive an input voltage, an output, and a switching means is presented. The switching means performs cycles where each cycle includes, switching the circuit such that the inductor enters into an energy charging state in which the inductor stores energy provided by the input voltage. When energy stored in the inductor reaches an energy threshold, the switching circuit operates such that the inductor enters into an energy discharging state in which the inductor provides energy to the output. The energy threshold is based on a predefined maximum energy storage current value and the time between cycles is based on a duration of the energy discharging state.

30 Claims, 7 Drawing Sheets

(56) References Cited

OTHER PUBLICATIONS

Texas Instruments bq25505 data sheet, ultra low-power boost charger with battery management and autonomous power multiplexer for primary batter in energy harvester applications, pp. 1, 11-14, Aug. 2013.

"Power Management Controller with Energy Harvesting Interface," by Marin SA, EM Microelectronic, EM8500, Copyright 2017, pp. 1-5.

Analog Devices ADP5090 data sheet, Ultralow Power Boost Regulator with MPPT and Charge Management, pp. 1, 11-15, Copyright 2014-2015.

* cited by examiner

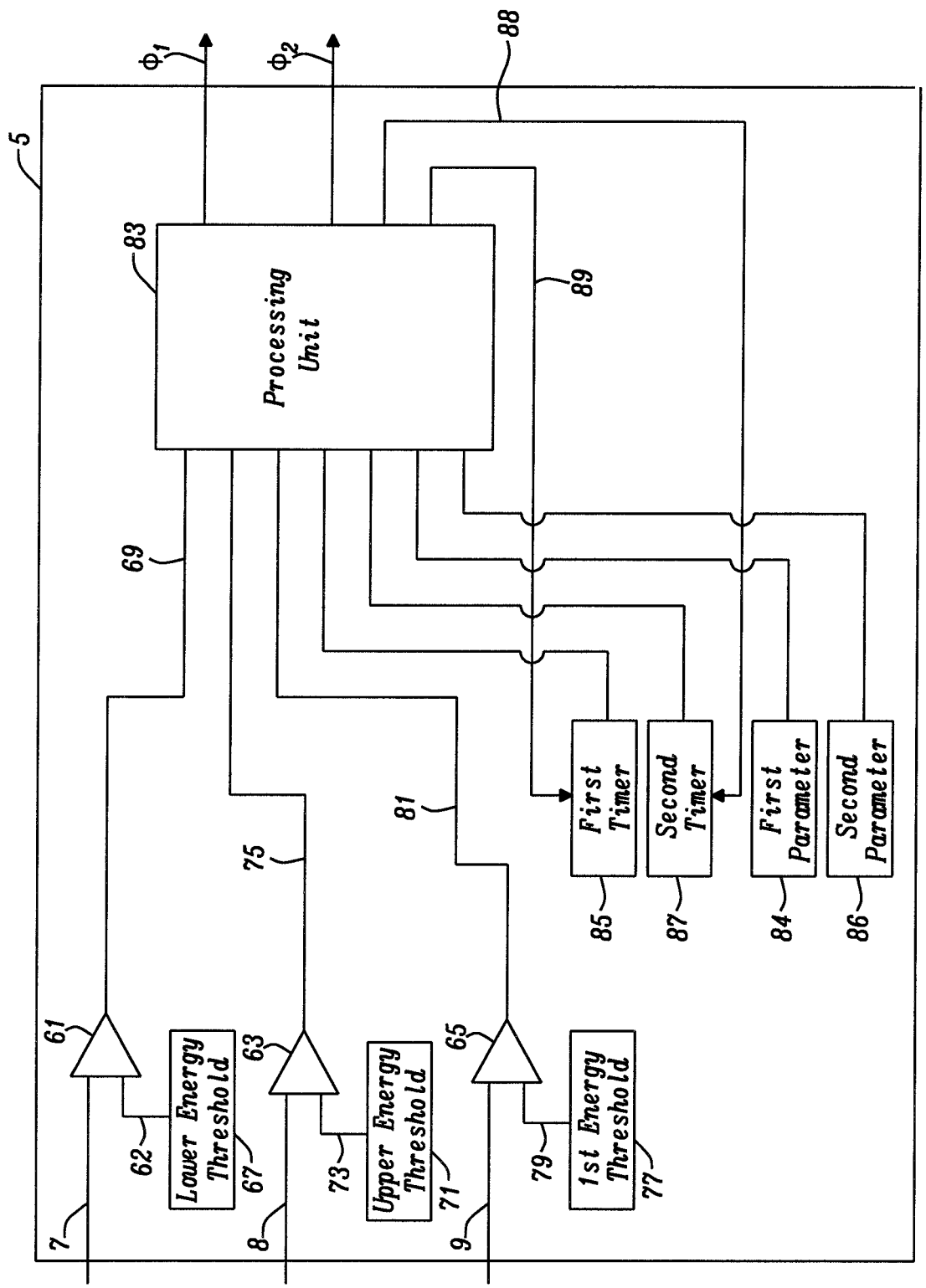

CONSTANT CURRENT CONSTANT VOLTAGE CHARGER BY MEANS OF A PULSE SKIPPING BOOST CONVERTER

TECHNICAL FIELD

The invention relates to a Constant Current Constant Voltage (CCCV) charging circuit for energy harvesting. The invention further relates to a method of operating a CCCV charging circuit for energy harvesting.

BACKGROUND

Energy harvesting is a process by which energy is derived from external sources, captured and stored for small, wireless autonomous devices, like those used in wearable electronics and wireless sensor networks, using energy harvesting integrated circuits (ICs). These energy harvesting ICs are used to transfer as much energy as possible from a source, for example a small solar-cell, to a storage device at the output, for example a small Li-ion battery, and are in fact boost converters controlled by the input and output voltage. A boost converter is a DC-to-DC power converter that steps up voltage (while stepping down current) from its input source to its output storage device. The boost converter circuit converts a source of DC from one voltage level to another by first charging an energy storage element using the input voltage from the energy harvester and then discharging the energy storage element in order to provide the energy at the output of the boost converter.

The way these energy harvester ICs work is as follows: while the input of the boost converter is above a certain threshold voltage and the output voltage is below another threshold (the maximum voltage allowed by the battery), the boost converter is active and is transferring energy from the input to the output.

In recent years, several of these devices entered the market, for e.g., from Texas Instruments: bq25504, bq25505, bq25570, from Analog Devices: ADP5090; from EM Microelectronics: EM8500 etc., to name a few. All these devices claim to be able to charge Li-ion batteries, but none of them have implemented a proper Constant current, constant voltage (CCCV) algorithm as is found for example, in normal Li-ion chargers.

A CCCV algorithm refers to a charging algorithm where initially a battery is charged at constant current. When the battery is nearly full, its voltage reaches the constant voltage setting of the charger, and the current decays exponentially as the battery finishes the charge.

FIG. 1 shows a typical example of battery voltage and battery current curve during CCCV charging. In the graphic shown in FIG. 1, the horizontal axis represents time and the vertical axis represents the battery current and the battery voltage. The CCCV battery charging shown in FIG. 1 follows a profile designed to ensure safety and long life without compromising performance. As shown in FIG. 1, in an initial phase 101 the battery voltage is below a first voltage threshold 200. For instance, the first voltage threshold 200 may be 3 Volts (V). In this initial phase, which goes from the time 101 until time 102, a small "pre-conditioning" current 201 of around 10% of the "full" current 202 is applied, which allows the battery from overheating until such a time that it is able to accept the full current 202. For instance, the full current 202 may be 1 C (wherein C is the total battery capacity divided by 1 hour. For instance, if the battery has a capacity of 500 milliamp/hour (mAh), then 1C means a charging current of 500 mA. And 0.1C means a charging current of 50 mA (in 1 hour, the battery is charged to 0.1 times its capacity=0.1×500 mAh=50 mA) and the small "pre-conditioning" current 201 may be 10% of the maximum current. During the constant current phase, which in FIG. 1 extends from 102 until 103, the battery voltage is above the first voltage threshold 200 and the battery is typically charged at a constant current 202 until the battery voltage reaches a second voltage threshold 203. The second voltage threshold 203 may be 4.1 V. When the battery voltage reaches the second voltage threshold 203, the charger switches to a constant voltage phase, which extends in time from 102 until 103 in FIG. 1, wherein the overcharging is eliminated. This transition from the constant current phase to the constant voltage phase has to be handled smoothly, by a charger, in order to ensure maximum capacity of a battery is reached without risking damage to the battery.

Maintaining a constant voltage during the constant voltage phase exponentially reduces the battery current until it reaches a third threshold, which may be 10% of the maximum charge current, at which an end of charge point 104 is detected and charging is ended. If the charger is left connected to the battery, a periodic 'top up' charge may be applied to counteract battery self-discharge. For e.g., the top-up charge may be typically initiated when the open-circuit voltage of the battery drops to less than 3.9 V, and terminates when the full-charge voltage of 4.1 V is again attained.

SUMMARY

None of the existing harvesting devices allows a CCCV charging of the battery.

Moreover, the boost-converters operate with a maximum peak inductor current, but since the duty-cycle is dependent on the ratio between input and output voltage, the average current to the output is also input and output voltage dependent, and hence not constant.

Therefore, it would be advantageous to implement a charging circuit that implements a proper CCCV algorithm.

An objective of the invention is to develop a charging circuit that can implement a proper CCCV algorithm. To better address this concern, a first aspect of the invention provides a charging circuit. The charging circuit comprises an inductor, an input configured to receive an input voltage, an output, and a switching means configured to perform cycles wherein each cycle comprises, switching the circuit such that the inductor enters into an energy charging state in which the inductor stores energy provided by the input voltage and, when an energy stored in the inductor reaches an energy threshold, switching the circuit such that the inductor enters into an energy discharging state in which the inductor provides energy to the output, wherein the energy threshold is based on a predefined maximum energy storage current value and, wherein the time between cycles is based on a duration of the energy discharging state. This may allow the charging circuit to operate efficiently by implementing a proper constant current phase of charging in a CCCV algorithm. The control of the time between cycles using the duration of the energy discharging state may allow to control the average output current of the charging circuit when the charging circuit is operating at the constant current phase.

The time between cycles may further be based on a predetermined average output current value.

The switching means may further be configured to start performing cycles when the input voltage is equal or greater than a first reference voltage value and an output voltage is lower than a second reference voltage value.

The inductor may comprise a first end connected to the input and a second end, and wherein the switching means may further comprise a first switch comprising a first end connected to the second end of the inductor and a second end connected to ground and wherein the first switch may be configured to connect the inductor to the ground such that the inductor enters into a charging state and to disconnect the inductor from the ground when the energy stored in the inductor reaches the energy threshold.

The switching means may further comprise one of a second switch or a diode having a first end connected to the second end of the inductor and having a second end connected to the output and wherein the second switch or the diode may be configured to connect the inductor to the output when the energy stored in the inductor reaches the energy threshold such that the inductor enters into a discharging state.

The charging circuit may further comprise a first comparator configured to compare the input voltage to the first reference voltage value.

The charging circuit may further comprise a second comparator to compare the output voltage to the second reference voltage value.

The charging circuit may further comprise a controller which may be configured to obtain a predetermined average output current value and a predetermined output end-of-charge current value.

The controller may be further configured to obtain the duration of the energy discharging state, determine the time between cycles based on the duration of the energy discharging state, the maximum energy storage current value and the predetermined average output current value, and control the switching means to perform cycles based on the duration of the energy discharging state and the determined time between cycles.

The switching means may be further configured to stop performing cycles when an end of charging is determined based on the duration of the energy discharging state.

The controller may be further configured to determine an end-of-charge time based on the duration of the energy discharging state, the maximum energy storage current value and the output end-of-charge current value.

In a particular example, determining the time between cycles by the controller may further comprise calculating a first ratio based on the maximum energy storage current value and the average output current value, and determining the time between cycles based on the duration of the energy discharging state and the calculated first ratio.

In a particular example, determining the end-of-charge time by the controller may further comprise calculating a second ratio using the maximum energy storage current value and the output end-of-charge current value, and determining the end-of-charge time based on the duration of the energy discharging state of the first cycle and the calculated second ratio.

In a particular example, the controller may be further configured to control the switching means to stop performing cycles if the output voltage is greater than the second reference voltage for a duration equal or greater than the end-of-charge time.

According to a second aspect of the present invention, a method performed by a charging circuit is provided. The method may comprise receiving an input voltage, performing cycles, wherein each cycle comprises, switching the circuit such that an inductor enters into an energy charging state in which the inductor stores energy provided by the input voltage and, when an energy stored in the inductor reaches an energy threshold, switch the circuit such that the inductor enters into an energy discharging state in which the inductor provides energy to an output, wherein the energy threshold is based on a predefined maximum energy storage current value and, wherein the time between cycles is based on a duration of the energy discharging state.

In a particular example, the time between cycles may be further based on a predetermined average output current value.

In a particular example, the method performed by the charging circuit may further comprise the step of starting to perform cycles when the input voltage is equal or greater than a first reference voltage value and an output voltage is lower than a second reference voltage value.

In a particular example, the inductor may comprise a first end connected to the input and a second end, and wherein a first switch comprising a first end connected to the second end of the inductor and a second end connected to ground and wherein the method may further comprises the steps of operating the first switch to connect the inductor to the ground such that the inductor enters into a charging state and to disconnect the inductor from the ground when the energy stored in the inductor reaches the energy threshold.

In a particular example, the method performed by the charging circuit may further comprise the step of one of a second switch or a diode having a first end connected to the second end of the inductor and having a second end connected to the output and wherein the method may further comprise the steps of operating the second switch or the diode to connect the inductor to the output when the energy stored in the inductor reaches the energy threshold such that the inductor enters into a discharging state.

In a particular example, the method performed by the charging circuit may further comprise the step of comparing the input voltage to the first reference voltage value using a first comparator.

In a particular example, the method performed by the charging circuit may further comprise the step of comparing the output voltage to the second reference voltage value using a second comparator.

In a particular example, the method performed by the charging circuit may further comprise the step of obtaining a predetermined average output current value and a predetermined output end-of-charge current value.

In a particular example, the method performed by the charging circuit may further comprise the steps of obtaining the duration of the energy discharging state, determining the time between cycles based on the duration of the energy discharging state, the maximum energy storage current value and the predetermined average output current value, and controlling to perform cycles based on the duration of the energy discharging state and the determined time between cycles.

In a particular example, the method performed by the charging circuit may further comprise the step of stopping to perform cycles when an end of charging is determined based on the duration of the energy discharging state.

The method performed by the charging circuit may further comprise the step of determining an end-of-charge time based on the duration of the energy discharging state, the maximum energy storage current value and the output end-of-charge current value.

In a particular example, determining the time between cycles may further comprise the steps of calculating a first ratio based on the maximum energy storage current value and the average output current value, and determining the time between cycles based on the duration of the energy discharging state and the calculated first ratio.

In a particular example, determining the end-of-charge time may further comprise the steps of calculating a second ratio using the maximum energy storage current value and the output end-of-charge current value, and determining the end-of-charge time based on the duration of the energy discharging state of the first cycle and the calculated second ratio.

In a particular example, the method performed by the charging circuit may further comprise the step of stopping to perform cycles if the output voltage is greater than the second reference voltage for a duration equal or greater than the end-of-charge time.

According to a third aspect of the present invention, a system comprising a charging circuit according to any of the above examples and a battery, wherein the battery is configured to be charged by the charging circuit may be implemented.

According to a fourth aspect of the present invention, a system comprising a charging circuit wherein the battery is configured to receive average output current value when an input voltage is equal or greater than a first reference voltage value and an output voltage is lower than a second reference voltage value.

The person skilled in the art will understand that the features described above may be combined in any way deemed useful. Moreover, modifications and variations described in respect of the system may likewise be applied to a method.

BRIEF DESCRIPTION OF THE DRAWINGS

In the following, aspects of the invention will be elucidated by means of examples, with reference to the drawings. The drawings are diagrammatic and are not drawn to scale.

FIG. 6 shows diagram of a control unit for an energy harvesting circuit.

DESCRIPTION

Embodiments of the present disclosure will be described herein below with reference to the accompanying drawings. However, the embodiments of the present disclosure are not limited to the specific embodiments and should be construed as including all modifications, changes, equivalent devices and methods, and/or alternative embodiments of the present disclosure.

The terms "have," "may have," "include," and "may include" as used herein indicate the presence of corresponding features (for example, elements such as numerical values, functions, operations, or parts), and do not preclude the presence of additional features.

The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may modify various elements regardless of an order and/or importance of the corresponding elements, and do not limit the corresponding elements. These terms may be used for the purpose of distinguishing one element from another element. For example, a first element may be referred to as a second element without departing from the scope the present invention, and similarly, a second element may be referred to as a first element.

The terms used in describing the various embodiments of the present disclosure are for the purpose of describing particular embodiments and are not intended to limit the present disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. The terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the present disclosure.

Figure 2:
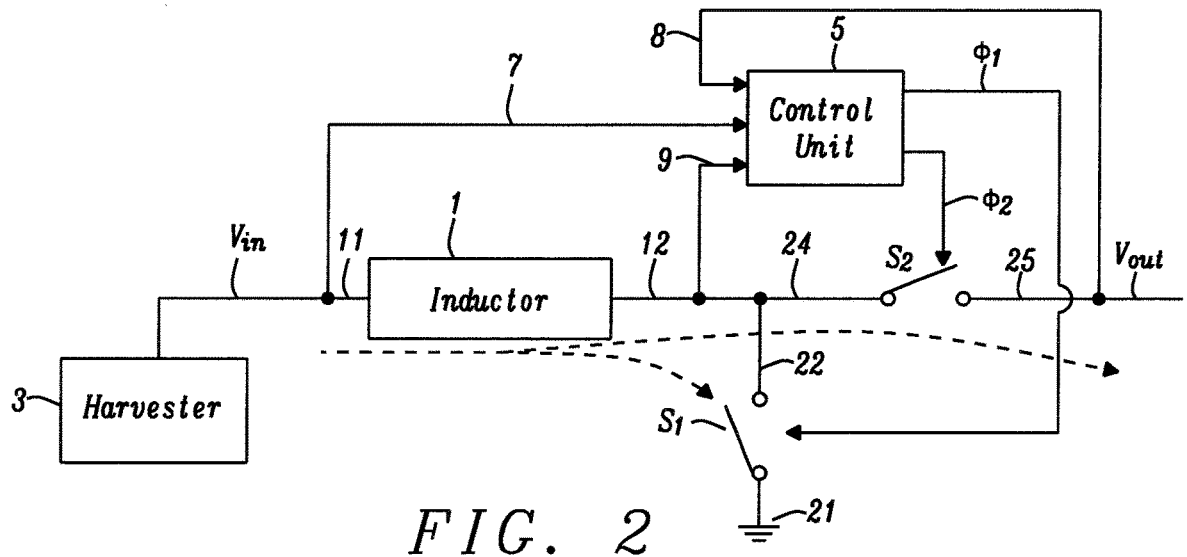
FIG. 2 shows a diagram of an energy harvesting circuit using a boost converter circuit.

For the purpose of determining the extent of protection conferred by the claims of this document, due account shall be taken of any element which is equivalent to an element specified in the claims. FIG. 2 illustrates a harvesting system using a boost converter circuit. The harvesting system of FIG. 2 comprises a harvester 3 (which may be for instance a PV-cell), an energy storage element 1 (which may be for instance an inductor L) and switches S1 and S2. The harvester 3 is connected to the boost converter circuit providing an input voltage $V_{in}$ to the boost converter circuit and the boost converter circuit provides an output voltage $V_{out}$ based on the input voltage $V_{in}$. The energy storage element 1 comprises a first end 11 and a second end 12. The first end 11 of the energy storage element 1 is connected to the input voltage $V_{in}$.

The switch $S_1$ comprises a first end 21 and a second end 22. The first end 21 of the switch $S_1$ is connected to the ground and the second end 22 of the switch $S_1$ is connected to the second end 12 of the energy storage element 1. The switch $S_2$ comprises a first end 24 and a second end 25. The first end 24 of the switch $S_2$ is connected to the second end 12 of the energy storage element 1 and the second end 25 of the switch $S_2$ is connected to the output voltage $V_{out}$. The switches may be implemented by any kind of suitable switching device, for e.g., a transistor, a diode, etc.

As illustrated in FIG. 2 boost converter circuit comprises also a control unit 5, wherein the control unit 5 comprises a first input 7, a second input 9 and a third input 8. The first input 7 is connected to the input voltage $V_{in}$, the second input 9 is configured to send the current measured in the inductor 1 to the control unit 5, and the third input 8 of the control unit 5 is connected to the output $V_{out}$. The control unit 5 is also configured to generate a first control signal $\phi_1$ and/or a second control signal $\phi_2$ in order to control the switching of $S_1$ and $S_2$ based on the first input 7 and/or the second input 9 and/or the third input 8.

The operation of the harvesting system using a boost convertor circuit of FIG. 2 will be now explained with reference to FIGS. 2, 3, 4, and 5.

Figure 3:
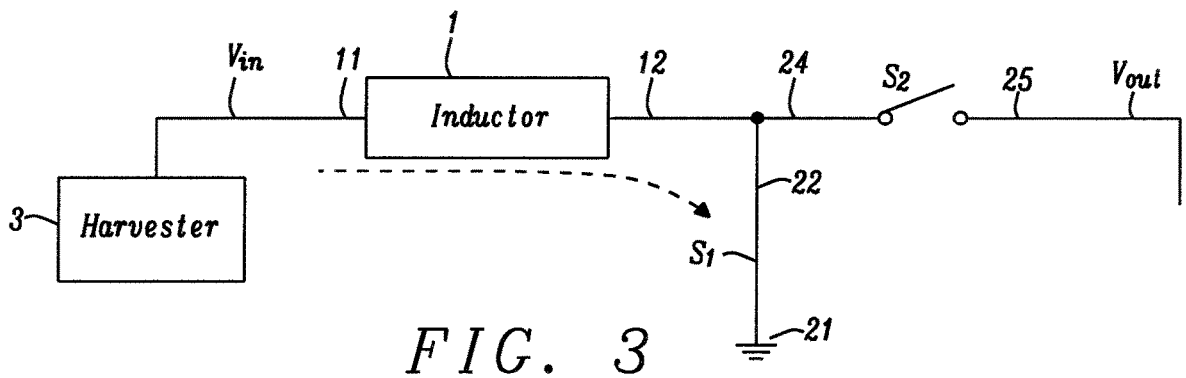
FIG. 3 shows a diagram of the energy harvesting circuit of FIG. 2 in a charging state in which the inductor L is charging energy.
Figure 4:
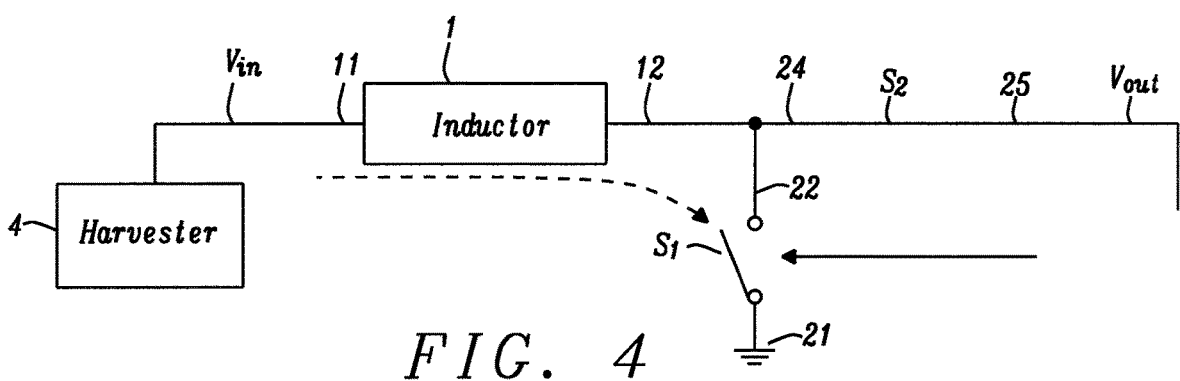
FIG. 4 shows a diagram of the energy harvesting circuit of FIG. 2 in which the inductor L is discharging energy.

FIGS. 2, 3 and 4 show an energy harvesting system in different states during operation. FIG. 2 shows a diagram of the energy harvesting circuit in a waiting state in which the energy storage element is not charging nor discharging energy, FIG. 3 shows a diagram of the energy harvesting circuit in a charging state in which the energy storage element is charging energy, and FIG. 4 shows a diagram of the energy harvesting circuit in a discharging state in which the energy storage element is discharging energy. FIG. 5 shows example waveforms of several signals as a function of time for the different states illustrated in FIGS. 2, 3, and 4. In the following example the energy storage element is an inductor and the current through the inductor $I_{inductor}$ represented in FIG. 5 is used as a measurement of the amount of energy stored in the inductor 1.

Figure 5A:
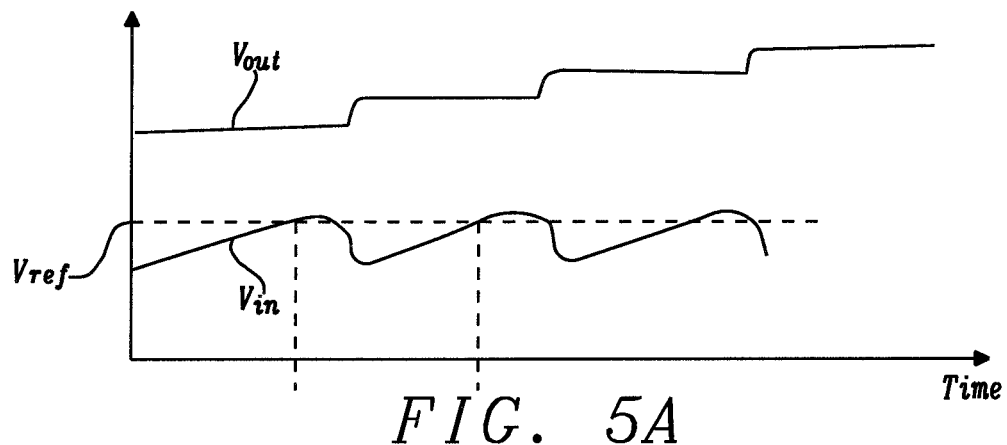
FIGS. 5A and 5B show diagrams of time waveforms of several signals of the energy harvesting circuit of FIG. 2 during operation.
Figure 5B:
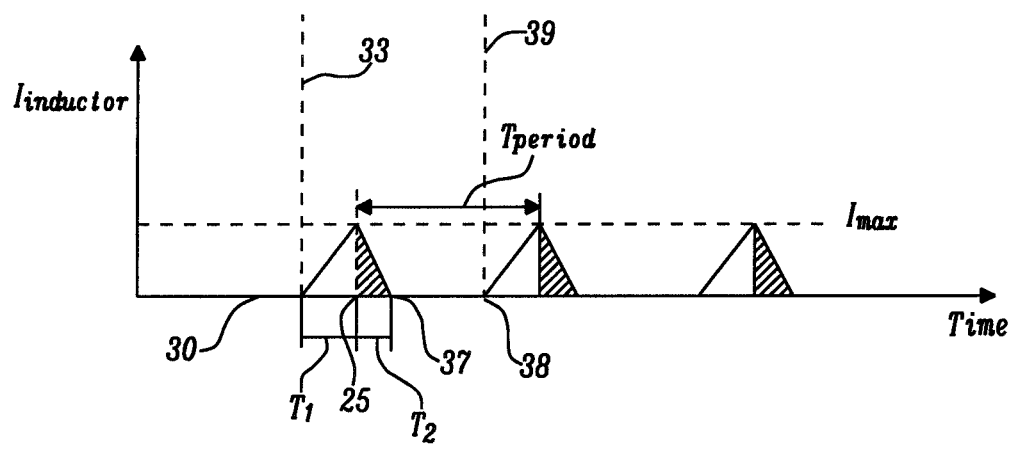

FIGS. 5A and 5B illustrate the values of $V_{in}$, $V_{out}$, and $I_{inductor}$ as a function of time for the different states illustrated in FIGS. 2, 3, and 4. The $I_{inductor}$ is the current through the inductor 1. As it can be seen in FIG. 5A, during the time interval 30 the input voltage $V_{in}$ is lower than a reference voltage $V_{ref}$ and both switches $S_1$ and $S_2$ are open. Therefore, the energy harvesting circuit is in a waiting state in which no current circulates through the inductor 1. When the $V_{in}$ reaches a reference voltage $V_{ref}$, at time 33, the control unit 5 sends a control signal $\phi_1$ to close the switch $S_1$ in order to connect the second end 12 of the inductor element 1 to the ground as it can be seen in FIG. 3. When the inductor 1 is connected to ground, the energy harvesting circuit enters into a charging state in which current flows through the inductor and the inductor 1 stores some energy by generating a magnetic field.

The current $I_{inductor}$ in the inductor 1 increases during the time interval 35 as it can be seen in FIG. 5B. When the current $I_{inductor}$ through the inductor element 1 reaches an upper energy threshold that in FIG. 5B is indicated by $I_{max}$, the control unit 5 sends a control signal $\phi_1$ to open the switch $S_1$ in order to disconnect the second end 12 of the inductor element 1 from the ground and the control unit 5 sends a control signal $\phi_2$ to close the switch $S_2$ in order to connect the second end 12 of the inductor element 1 to the output $V_{out}$ as it can be seen in FIG. 5B. When the inductor 1 is connected to the output $V_{out}$, the energy harvesting circuit enters into a discharging state in which, during the time interval 37, the energy previously accumulated in the inductor 1 is transferred to the output $V_{out}$ and the current $I_{inductor}$ in the inductor 1 starts decreasing, as it can be seen in FIG. 5B.

Time intervals that go from time point 30 to time point 35 and from time point 35 to time point 37 represent a DCM event wherein a completed switching cycle has been performed by the circuit. The DCM refers to a conduction mode in which the inductor current $I_{inductor}$ in the energy transfer may fall to zero level which is a common occurrence in a boost converter circuit. A new DCM event starts at time point 38. Although in FIG. 5A the circuit performs only one DCM event each time $V_{in}$ reaches $V_{ref}$, the circuit may perform any number of DCM cycles whenever $V_{in}$ is above $V_{ref}$. As it can be seen in FIG. 5B, $T_{period}$ represents the time between one DCM event and the next DCM event.

Thus, during a first phase, represented as $T_1$ in FIG. 5B, the current in the inductor 1 increases during the interval 35 as it can be seen in FIG. 5B and energy is stored in the inductor 1. during a second phase, represented as $T_2$ in FIG. 5B, the inductor 1 is connected to the output $V_{out}$, the energy harvesting circuit enters into a discharging state in which, during the time interval 37, the energy previously accumulated in the inductor 1 is transferred to the output $V_{out}$, and the current in the inductor $i_{inductor}$ starts decreasing, as it can be seen in FIG. 5B. The charge transferred to the output per DCM cycle is equal to:

$$Q_{out} = \frac{1}{2} \cdot T_2 \cdot I_{max} \quad \text{(equation 1)}$$

Thus, if DCM events are occurring at a fixed $$\text{frequency} = 1/T_{period},$$

then the average output current $I_{outaverage}$ flowing to the output $V_{out}$ can be calculated as:

$$I_{out,average} = \frac{T_2}{T_{period}} \cdot \frac{1}{2} \cdot I_{max} \quad \text{(equation 2)}$$

In this case, by knowing $I_{max}$, it is possible to limit the average output current to a certain value $L_{limit}$ by simply making $T_{period}$ (the time between two consecutive DCM events) a constant factor higher than $T_2$ as shown in equation 3:

$$T_{period} \geq T_2 \cdot \left(\frac{1}{2} \cdot \frac{I_{max}}{I_{limit}}\right) \quad \text{(equation 3)}$$

Although the above example has considered that DCDC circuit working in a DCM mode, the circuit may be working in a continuous mode wherein the current at the inductor 1 does not discharge to zero after each charging period $T_1$, but it does discharge to a lower energy threshold.

FIG. 6 shows an example of the control unit 5 of FIGS. 2, 3 and 4 in which the same reference numbers refer to the same components as in FIGS. 2, 3 and 4. Although the following example will consider that the control unit is implemented as one device, the control unit may be implemented in the form of separate devices placed in several suitable parts of the DCDC circuit. The control unit 5 of FIG. 6 comprises a first comparator unit 61 and a second comparator unit 63 and a third comparator unit 65. The first comparator unit 61 is configured to receive the first input 7, to receive a lower energy threshold 67 ($V_{ref}$) at an input line 62, to compare the first input 7 to the lower energy threshold 67 and, based on the result of the comparison, to output a first comparison result 69. The second comparator unit 63 is configured to receive the second input 8, to receive an upper energy threshold 71 ($V_{max}$) at an input line 73, to compare the second input 8 to the upper energy threshold 71 and based on the result of the comparison, to output a second comparison result 75. The third comparator unit 65 is configured to receive a third input 9, to receive a first energy threshold ($I_{max}$) 77 at an input line 79, to compare the third input 9 to the first energy threshold 77 and, based on the result of the comparison, to output a third comparison result 81. The control unit 5 of FIG. 6 also comprises a first timer 85 and a second timer 87. The control unit 5 of FIG. 6 also comprises a processing unit 83 configured to receive the first comparison result 69, to receive the second comparison result 75, to receive the third comparison result 81, to receive the first timer 85, to receive the second timer 87, to receive a first parameter ($I_{limit}$) 84 and to receive a second parameter ($I_{end\ of\ charge}$) 86 and, based on the first comparison result 69, the second comparison result 75, the third comparison result 81, the first timer 85, the second timer 87, the first parameter 84 and the second parameter 86, to generate the first control signal $\varphi_1$, the second control signal $\varphi_2$, a third control signal 89 to control the first timer 85 and a fourth control signal 88 to control the second timer 87.

Figure 7:
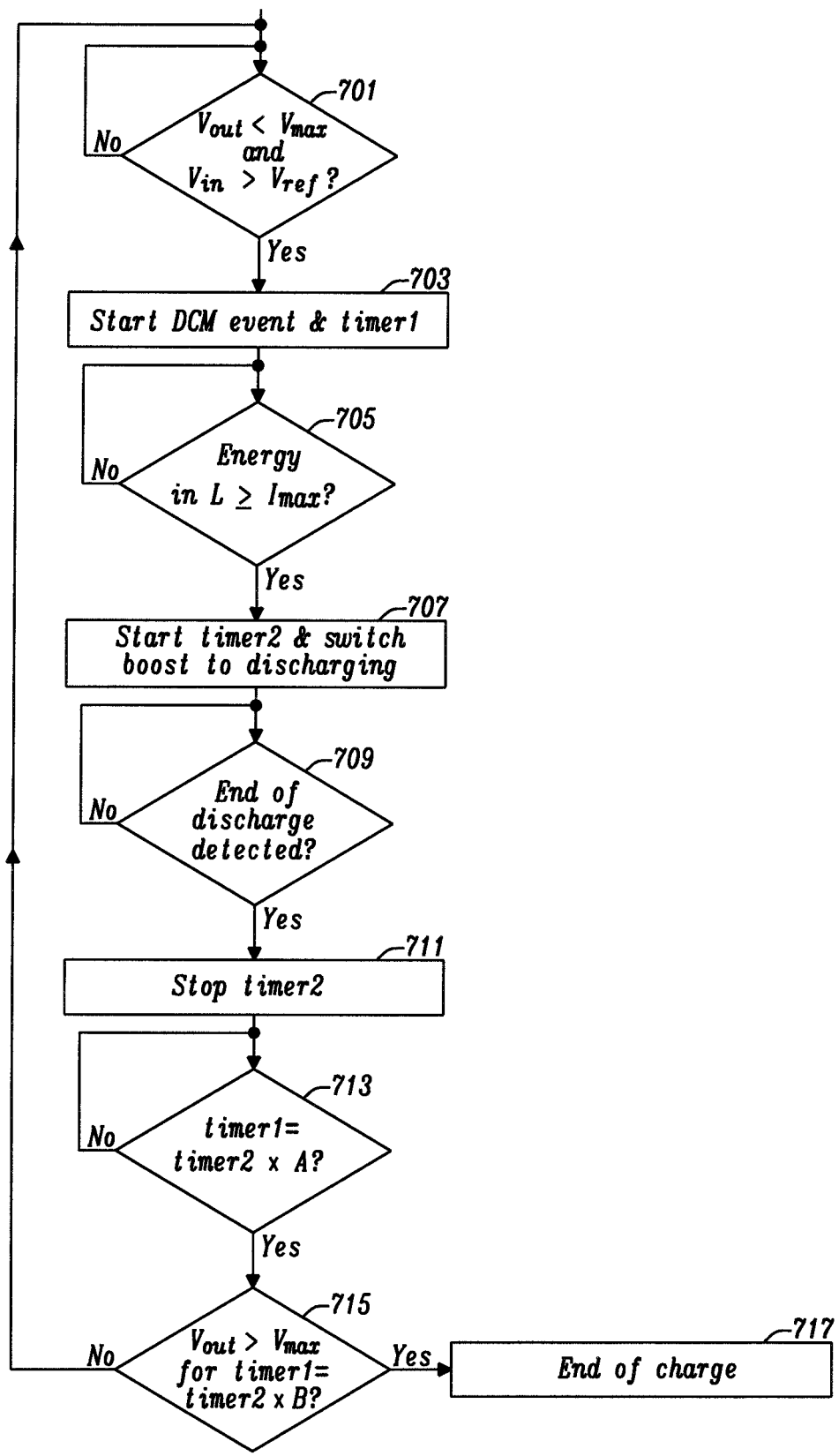
FIG. 7 shows a flow diagram illustrating an energy harvesting method.
Figure 8A:
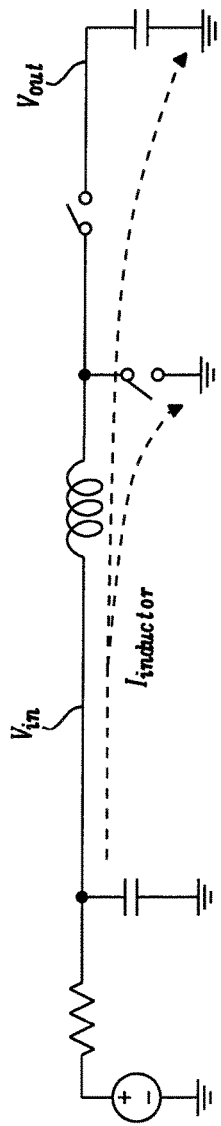
FIGS. 8A, 8B, 8C and 8D show diagrams of time waveforms of several signals of the energy harvesting circuit of FIG. 2 during CCCV charging.
Figure 8B:
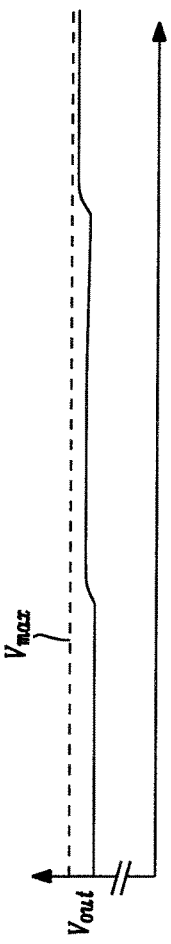
Figure 8C:
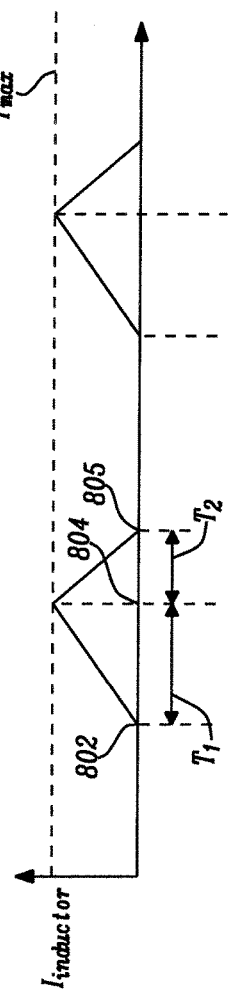
Figure 8D:
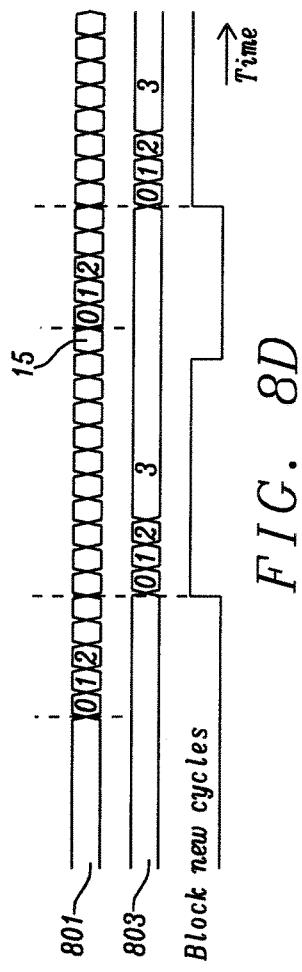
Figure 9A:
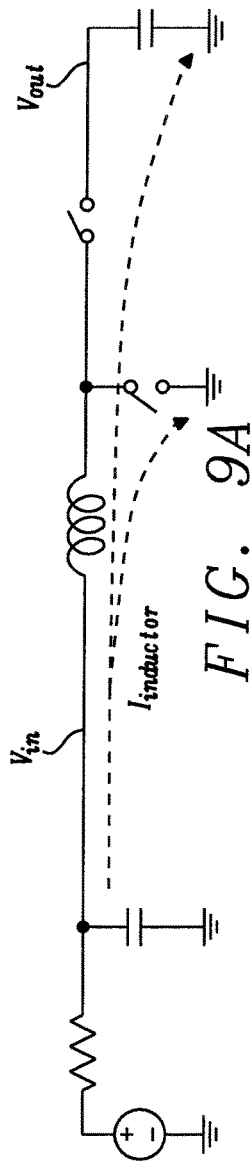
FIGS. 9A, 9B, 9C and 9D show diagrams of time waveforms of several signals of the energy harvesting circuit of FIG. 2 reaching the end of charge.
Figure 9B:
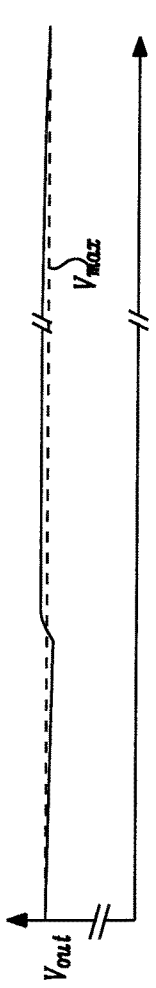
Figure 9C:
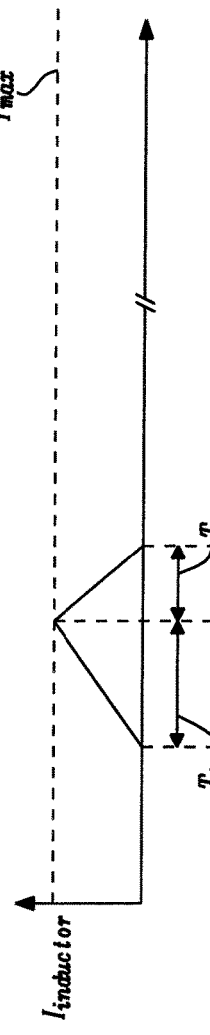
Figure 9D:
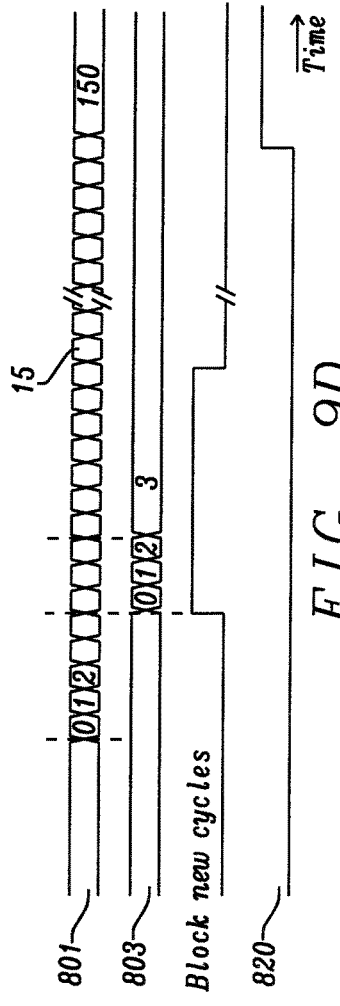

FIG. 7 shows a flow diagram illustrating an energy harvesting method providing CCCV charging and FIGS. 8A, 8B, 8C, 8D and 9A, 9B, 9C, 9D show diagrams of time waveforms of several signals of the energy harvesting circuit of FIG. 2 during CCCV charging.

This is only an example, and many different modifications of the energy harvesting method providing CCCV charging are possible. In this example, the boost converter in the energy harvesting system is only used to produce DCM cycles when the output voltage $V_{out}$ is lower than an upper energy threshold. The upper energy threshold may be equal to maximum voltage $V_{max}$. The maximum voltage $V_{max}$ may be based on a battery connected at the output of the boost converter circuit for charging, such as for instance, manufacturing parameters of the battery that needs to be charged. The maximum voltage $V_{max}$ may be determined in any other suitable way.

The CCCV charging method in the energy harvesting system is based on the following ideas:

1. The average output current $I_{outaverage}$ of the boost converter circuit can be controlled by making the time period $T_{period}$ between one DCM event and the next DCM event proportional to the duration $T_2$ of the second phase of the boost converter circuit (discharging state). This may be used during the constant current phase of a charging process as the one shown, for instance, in FIG. 1, when the battery voltage is equal to or greater than a second threshold 203.

2. The average output current $I_{outaverage}$ of the boost converter circuit can be measured when deriving the duration $T_2$ of the discharging state divided by the time period $T_{period}$ between one DCM event and the next DCM event. This may be used to detect the end of charge point of the battery (point 104 in FIG. 1).

Figure 1:
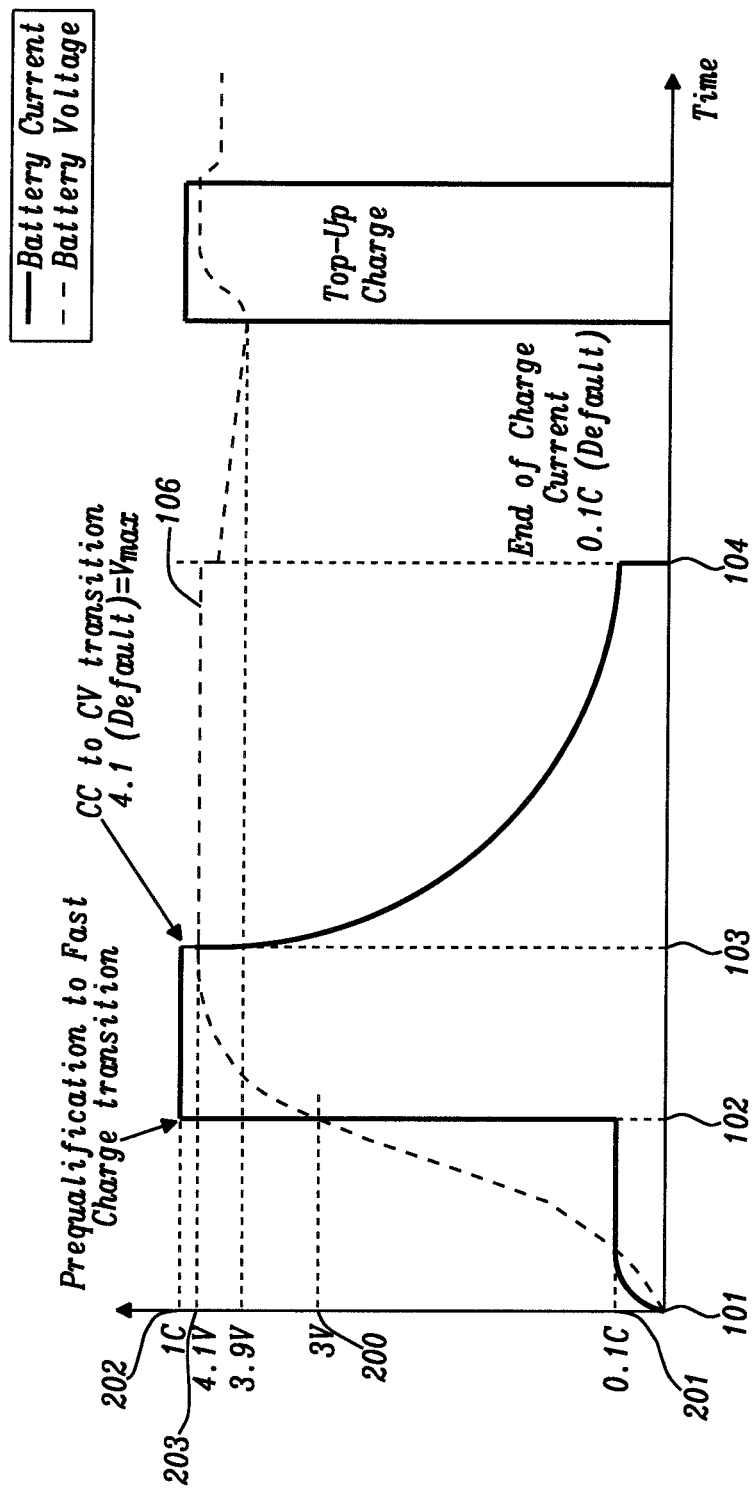
FIG. 1 shows a typical example of battery voltage and current during CCCV charging.

In the energy harvesting method shown in FIG. 7, the boost converter circuit operates in DCM and the inductor element 1 can reach an energy threshold $I_{max}$. The boost converter circuit only produces DCM events when the output voltage gout is below the maximum voltage $V_{max}$ of the battery which may be, for example, 4.1 Volts as shown in FIG. 1.

In step 701 of the method of FIG. 7, it is checked whether the input voltage $V_{in}$ of the boost converter circuit is equal or greater than a lower energy threshold $V_{ref}$ and the output voltage $V_{out}$ is smaller than the maximum voltage $V_{max}$. If the input voltage $V_{in}$ of the boost converter circuit is equal or greater than $V_{ref}$ and the output voltage $V_{out}$ is smaller than the maximum voltage $V_{max}$, then in step 703 a DCM event starts and a first timer is also started. In FIG. 8 it can be seen how the first timer 801 is started at the beginning of a DCM cycle 802 of the boost converter circuit.

In step 705, if the energy stored in the inductor reaches the energy threshold $I_{max}$, i.e., if the energy charging part of the DCM event ends, then the method of FIG. 7 proceeds to step 707 wherein the boost converter circuit is switched to the discharging phase and the second timer is started.

In step 709, it is checked whether the discharging phase of the DCM event ends. When in step 709 it is detected that the discharging phase of the DCM event ends, the method proceeds to step 711 wherein the second timer is stopped and the time measured by the second timer, $T_2$ (time of the discharging phase) is stored. In step 713, the method of FIG. 7 checks whether the first timer is equal or above a factor $$A = T_2 \cdot \left( \frac{1}{2} \cdot \frac{I_{max}}{I_{limit}} \right)$$

wherein $I_{limit}$ is the value to which the average output current should be limited and, when the first timer reaches $$T_2 \cdot \left( \frac{1}{2} \cdot \frac{I_{max}}{I_{limit}} \right).$$

In this way, next DCM events are blocked until the first timer 801 has expired the result of the second timer 803 multiplied by the calculated factor A.

The method of FIG. 7 in step 715 uses the second timer for checking whether $V_{out}$ has been above $V_{max}$ during a time equal or longer than a factor $$B = T_2 \cdot \left( \frac{1}{2} \cdot \frac{I_{max}}{I_{end\ of\ charge}} \right).$$

If step 715 is true, the method proceeds to step 717 wherein end of charge is detected and DCM events are blocked until the battery voltage has dropped below a certain threshold (in FIG. 1 this is 3.9 V). If step 715 is false, the method proceeds to step 701 wherein a new DCM event will start if the conditions of step 701 are true.

As illustrated in FIG. 1, $I_{limit}$ may be 0.1 C during the initial phase 101 when the battery voltage (output voltage $V_{out}$) is less than the first threshold 200 (3V in FIG. 1) and the maximum output current limit $I_{limit}$ is 1 C during the constant current phase 102 when the battery voltage is equal or greater than the first threshold 200 and less than the second threshold 203 (4 V in FIG. 1).

As an example, $I_{max}$=200 mA, $I_{limit}$=20 mA and $I_{end\ of\ charge}$=2 mA. This means factor A is equal to $$\frac{1}{2} \cdot \frac{200\ \text{mA}}{20\ \text{mA}} = 5$$

and factor B is equal to $$\frac{1}{2} \cdot \frac{200\ \text{mA}}{20\ \text{mA}} = 50$$

The second timer 803 measures that the discharging phase of the boost converter circuit phase lasts 3 clock cycles. This means that the first timer 801 has to count at least 15 clock cycles before a next DCM event is allowed to start. In case the battery voltage is not below the maximum voltage before the first timer 801 has reached 150 clock cycles, then the end of charge point has been detected.

The above example assumes that the output voltage $V_{out}$ of the boost converter circuit is below the maximum voltage $V_{max}$ and the input voltage $V_{in}$ is above a minimum voltage $V_{ref}$ (so the boost-converter wants to produce new DCM events).

If, on the other hand, the output voltage $V_{out}$ is above the maximum voltage $V_{max}$ and stays above said value for at least 150 clock cycles of the first timer 801, then the end of charge point is detected.

The current into the battery is not really constant, but consists of short pulses. This can be solved by adding a capacitor at the output of the boost converter circuit in parallel with the battery. Optionally a resistor could be added in series with the battery. The capacitor and resistor will form a low-pass filter, preventing the current spikes to enter the battery and let the battery only see the average current.

The examples and embodiments described herein serve to illustrate rather than limit the invention. The person skilled in the art will be able to design alternative embodiments without departing from the scope of the claims. Reference signs placed in parentheses in the claims shall not be interpreted to limit the scope of the claims. Items described as separate entities in the claims or the description may be implemented as a single hardware or software item combining the features of the items described.

What is claimed is:

1. A charging circuit comprising:
   an inductor;
   an input configured to receive an input voltage;
   an output; and
   further comprising a switching means configured to perform cycles wherein each cycle comprises, switching the circuit such that the inductor enters into an energy charging state in which the inductor stores energy provided by the input voltage and, when an energy stored in the inductor reaches an energy threshold, switching the circuit such that the inductor enters into an energy discharging state in which the inductor provides energy to the output;
   wherein the energy threshold is based on a predefined maximum energy storage current value and,
   wherein the time between cycles is based on a duration of the energy discharging state.

2. The charging circuit of claim 1, wherein the time between cycles is further based on a predetermined average output current value.

3. A system comprising a charging circuit according to claim 2, and a battery, wherein the battery is configured to receive average output current value when an input voltage is equal or greater than a first reference voltage value and an output voltage is lower than a second reference voltage value.

4. The charging circuit of claim 1, wherein the switching means are further configured to start performing cycles when the input voltage is equal or greater than a first reference voltage value and an output voltage is lower than a second reference voltage value.

5. The charging circuit of claim 4, further comprises a first comparator configured to compare the input voltage to the first reference voltage value.

6. The charging circuit of claim 4, further comprises a second comparator to compare the output voltage to the second reference voltage value.

7. The charging circuit of claim 1, wherein the inductor comprises a first end connected to the input and a second end, and wherein the switching means comprise a first switch comprising a first end connected to the second end of the inductor and a second end connected to ground and wherein the first switch is configured to connect the inductor to the ground such that the inductor enters into a charging state and to disconnect the inductor from the ground when the energy stored in the inductor reaches the energy threshold.

8. The charging circuit of claim 7, wherein the switching means further comprises one of a second switch or a diode having a first end connected to the second end of the inductor and having a second end connected to the output and wherein the second switch or the diode is configured to connect the inductor to the output when the energy stored in the inductor reaches the energy threshold such that the inductor enters into a discharging state.

9. The charging circuit of claim 1, further comprising:
   a controller configured to:
   obtain a predetermined average output current value and a predetermined output end-of-charge current value.

10. The charging circuit of claim 9, wherein the controller is further configured to:
    obtain the duration of the energy discharging state;
    determine the time between cycles based on the duration of the energy discharging state, the maximum energy storage current value and the predetermined average output current value; and
    control the switching means to perform cycles based on the duration of the energy discharging state and the determined time between cycles.

11. The charging circuit of claim 10, wherein the switching means are further configured to stop performing cycles when an end of charging is determined based on the duration of the energy discharging state.

12. The charging circuit of claim 11, wherein the controller is further configured to:
    determine an end-of-charge time based on the duration of the energy discharging state, the maximum energy storage current value and the output end-of-charge current value.

13. The charging circuit of claim 12, wherein determining the end-of-charge time by the controller further comprises:
    calculating a second ratio using the maximum energy storage current value and the output end-of-charge current value; and
    determining the end-of-charge time based on the duration of the energy discharging state of the first cycle and the calculated second ratio.

14. The charging circuit of claim 12, wherein the controller is further configured to control the switching means to stop performing cycles if the output voltage is greater than the second reference voltage for a duration equal or greater than the end-of-charge time.

15. The charging circuit of claim 10, wherein determining the time between cycles by the controller further comprises:
    calculating a first ratio based on the maximum energy storage current value and the average output current value; and
    determining the time between cycles based on the duration of the energy discharging state and the calculated first ratio.

16. A system comprising a charging circuit according to claim 1, and a battery, wherein the battery is configured to be charged by the charging circuit.

17. A method performed by a charging circuit, the method comprising the steps of:
    receiving an input voltage;
    performing cycles, wherein each cycle comprises, switching the circuit such that an inductor enters into an energy charging state in which the inductor stores energy provided by the input voltage and, when an energy stored in the inductor reaches an energy threshold, switch the circuit such that the inductor enters into an energy discharging state in which the inductor provides energy to an output,
    wherein the energy threshold is based on a predefined maximum energy storage current value and,
    wherein the time between cycles is based on a duration of the energy discharging state.

18. The method of claim 17, wherein the time between cycles is further based on a predetermined average output current value.

19. The method of claim 17, further comprising the step of starting to perform cycles when the input voltage is equal or greater than a first reference voltage value and an output voltage is lower than a second reference voltage value.

20. The method of claim 19, further comprising the step of comparing the input voltage to the first reference voltage value using a first comparator.

21. The method of claim 19, further comprising the step of comparing the output voltage to the second reference voltage value using a second comparator.

22. The method of claim 17, wherein the inductor comprises a first end connected to the input and a second end, and wherein a first switch comprising a first end connected to the second end of the inductor and a second end connected to ground and wherein the method further comprises the steps of operating the first switch to connect the inductor to the ground such that the inductor enters into a charging state and to disconnect the inductor from the ground when the energy stored in the inductor reaches the energy threshold.

23. The method of claim 22, further comprising the step of one of a second switch or a diode having a first end connected to the second end of the inductor and having a second end connected to the output and wherein the method further comprises the steps of operating the second switch or the diode to connect the inductor to the output when the energy stored in the inductor reaches the energy threshold such that the inductor enters into a discharging state.

24. The method of claim 17, further comprising the step of:
    obtaining a predetermined average output current value and a predetermined output end-of-charge current value.

25. The method of claim 24, further comprising the steps of:
    obtaining the duration of the energy discharging state;
    determining the time between cycles based on the duration of the energy discharging state, the maximum energy storage current value and the predetermined average output current value; and
    controlling to perform cycles based on the duration of the energy discharging state and the determined time between cycles.

26. The method of claim 25, further comprising the step of stopping to perform cycles when an end of charging is determined based on the duration of the energy discharging state.

27. The method of claim 26, further comprising the step of:
    determining an end-of-charge time based on the duration of the energy discharging state,
    the maximum energy storage current value and the output end-of-charge current value.

28. The method of claim 27, wherein determining the end-of-charge time further comprises the steps of:
    calculating a second ratio using the maximum energy storage current value and the output end-of-charge current value; and
    determining the end-of-charge time based on the duration of the energy discharging state of the first cycle and the calculated second ratio.

29. The method of claim 27, further comprising the step of stopping to perform cycles if the output voltage is greater than the second reference voltage for a duration equal or greater than the end-of-charge time.

30. The method of claim 25, wherein determining the time between cycles further comprises the steps of:
    calculating a first ratio based on the maximum energy storage current value and the average output current value; and
    determining the time between cycles based on the duration of the energy discharging state and the calculated first ratio.

* * * * *